US009797957B2

(12) United States Patent
Lee

(10) Patent No.: US 9,797,957 B2
(45) Date of Patent: Oct. 24, 2017

(54) DETECTING APPARATUS FOR AC MOTOR MALFUNCTION AND DISTRIBUTION PANEL HAVING THE SAME

(71) Applicant: SeoungChoul Lee, Daejeon (KR)

(72) Inventor: SeoungChoul Lee, Daejeon (KR)

( * ) Notice: Subject to any disclaimer, the term of this patent is extended or adjusted under 35 U.S.C. 154(b) by 58 days.

(21) Appl. No.: 15/012,305

(22) Filed: Feb. 1, 2016

(65) Prior Publication Data

US 2016/0226429 A1    Aug. 4, 2016

(30) Foreign Application Priority Data

Feb. 3, 2015 (KR) .......................... 10-2015-0016657

(51) Int. Cl.
*G01R 31/34* (2006.01)
*H02P 29/024* (2016.01)
*G01R 25/00* (2006.01)

(52) U.S. Cl.
CPC .......... *G01R 31/343* (2013.01); *G01R 25/005* (2013.01); *H02P 29/024* (2013.01)

(58) Field of Classification Search
CPC ...... H02P 29/00; H02P 29/02; H02P 29/0241; H02P 29/027
USPC ......... 318/434, 448, 478.479, 500, 504, 722
See application file for complete search history.

(56) References Cited

U.S. PATENT DOCUMENTS

| 5,903,128 | A  | * | 5/1999 | Sakakibara | ............... | H02P 6/18 318/400.28 |
| 6,208,109 | B1 | * | 3/2001 | Yamai | ...................... | H02P 6/10 318/430 |
| 7,504,784 | B2 | * | 3/2009 | Asada | ................... | D06F 37/304 318/400.02 |
| 8,847,529 | B2 | * | 9/2014 | Dixon | ..................... | H02P 21/18 318/400.02 |
| 9,379,648 | B2 | * | 6/2016 | Lamsahel | ............. | H02P 29/024 |

FOREIGN PATENT DOCUMENTS

KR    10-2012-0100280 A    9/2012

* cited by examiner

*Primary Examiner* — Bentsu Ro
(74) *Attorney, Agent, or Firm* — Rabin & Berdo, P.C.

(57) ABSTRACT

A detecting apparatus for AC motor malfunction by using a current delay property of an AC motor and outputting a malfunction signal to an alarming device is presented. The detecting apparatus for AC motor malfunction includes a voltage phase delay setting unit, a voltage phase conversion unit, a current phase detecting unit, a current phase conversion unit, a phase comparator, a sawtooth wave generating unit, a phase difference detecting unit, a phase shift bandwidth setting unit, a noise filtering unit, and a malfunction signal output unit.

9 Claims, 2 Drawing Sheets

DETECTING APPARATUS FOR AC MOTOR MALFUNCTION AND DISTRIBUTION PANEL HAVING THE SAME

BACKGROUND OF THE PRESENT INVENTION

1. Field of the Present Invention

The present invention relates to a detecting apparatus for AC motor malfunction and a distribution panel having the same, and more specifically, to a detecting apparatus for AC motor malfunction and a distribution panel having the same capable of detecting an abnormal state by using a current delay property of an AC motor and outputting a malfunction signal to an alarming device, a shutdown device or a recording device etc.

2. Description of the Related Art

Generally, where it has a failure in an AC motor, an alarm is sounded or an operation of the motor is cut off. Also, it inspects the overload of the motor through the measurement of the current and the motor is stopped in case of overload current so as to protect it from the overload. However, since this overcurrent detection mode is an alternative to the fault current, it is insufficient to previously protect the motor.

Defect inspection of insulation layer of a motor coil is conducted by measuring an insulation resistance or a visual inspection of the skilled expert, after it stops the motor. However, it is difficult to find out a weak layer insulation failure such as a short circuit of coils etc. through the insulation resistance measurement method or the visual detection.

Korea published patent KR10-2012-0100280A discloses a single AC motor controller for detecting a malfunction of a single phase AC motor based on the counter electromotive force. In the prior art, it detects the counter electromotive force, outputs pulse signals in proportion to the counter electromotive force at a predetermined distance of time, and determines the malfunction of the motor based on two pulse signals. However, in the detection of the motor malfunction using the counter electromotive force, the reverse rotation of the motor or the lifetime of the phase capacitor can be only detected. That is, it is difficult to determine overheat, overcurrent, and layer insulation failure etc. of the motor.

SUMMARY OF THE PRESENT INVENTION

The object of the present invention, which has been developed according to the aforementioned necessity, is to provide a detecting apparatus for AC motor malfunction and a distribution panel having the same capable of detecting a motor malfunction, which is hard to measure in the prior art, to the high sensitivity by detecting the malfunction of the AC motor using the current delay property of the AC motor, detecting various malfunctions of the motor through a single detection circuit, and diagnosing the malfunction of the motor before the motor trouble is generated.

According to an aspect of the present invention to achieve the object described above, there is provided a detecting apparatus for AC motor malfunction including: a voltage phase delay setting unit 130 connected to a voltage input terminal of an AC motor and delaying a phase of an input voltage from 0° to 90°; a voltage phase conversion unit 100 having a first comparator IC1 for comparing an output of the voltage phase delay setting unit 130 with a reference voltage and converting a voltage phase into a square wave to be outputted; a current phase detecting unit 210 connected to a current input terminal of the AC motor and detecting a current phase flowing to a load side in a form of a square wave; a current phase conversion unit 200 having a second comparator IC2 for comparing an output of the current phase detecting unit 210 with the reference voltage and converting a current phase into a square wave to be outputted; a phase comparator 300 having a third comparator IC3 for comparing a output combining portion of the voltage phase conversion unit 100 and the current phase conversion unit 200 with the reference voltage and outputting a phase difference of the current phase and voltage phase in a form of a square wave; a sawtooth wave generating unit 400 for integrating an output of the phase comparator 300 to be converted in the form of the sawtooth wave; a phase difference detecting unit 500 having a fourth comparator IC4 for comparing an output of the sawtooth wave generating unit 400 with the reference voltage and outputting a pulse signal corresponding to the phase difference of the voltage phase and the current phase; a noise filtering unit 520 having a ripple counter IC5 for counting an output of a phase difference detecting unit 500 and generating an output when the accumulated count value is larger than a predetermined value; and a malfunction signal output unit 600 switched according to the output of the noise filtering unit 520 so as to output a malfunction signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Typically, since the alternating-current motor has inductor characteristics, the current phase is delayed with respect to the phase of the supplied voltage. The phenomenon of the current delay is variously changed depending on the state of the AC motor. For example, in the idling condition, the current phase is delayed. However, when the mechanical loading is applied thereto, the current phase becomes faster. In this case, if the core of the motor is overheated or several short circuits are generated owing to the poor layer insulation of the coil, the phase of the current is much faster. Besides, in case of the overheat, the overload, the arc generation owing to the contact failure, the coil break, and the capacitor short-circuit for operation etc., the phase of the current is faster or delayed relative to the normal state. In the present invention, it detects the malfunctions by using the current delay characteristic of the AC motor and transmits the result of detection to an alarming device, a shutdown device or a recording device etc.

The present invention includes the AC motor malfunction detection apparatus as well as the distribution panel provided with the AC motor malfunction detection apparatus. Here, the distribution panel can include a high-voltage distribution panel for supplying the high-voltage to a consumer, a low-voltage distribution for supplying the low-voltage thereto, a distribution board for again distributing the trunk lines power-distributed in the distribution panel, and the power panel applied to a Motor Control Center (MCC). For example, the distribution panel usually includes a bus bar for leading-in a power transmission line, a connecting terminal connected to the power distribution side, and a switching device such as a main circuit breaker and an earth leakage circuit breaker etc. Also, it can further include the detecting apparatus for AC motor malfunction as described below, the alarming device operated according to the detection result, the shutdown device or the recording device. The bus bar, the connecting terminal, the switch device, the alarming device generated according to the malfunction detection signal, the shutdown device, and the recording device etc. are generally known.

Hereinafter, detailed embodiments for implementing the present invention will be explained with referenced to the drawings.

Figure 1:
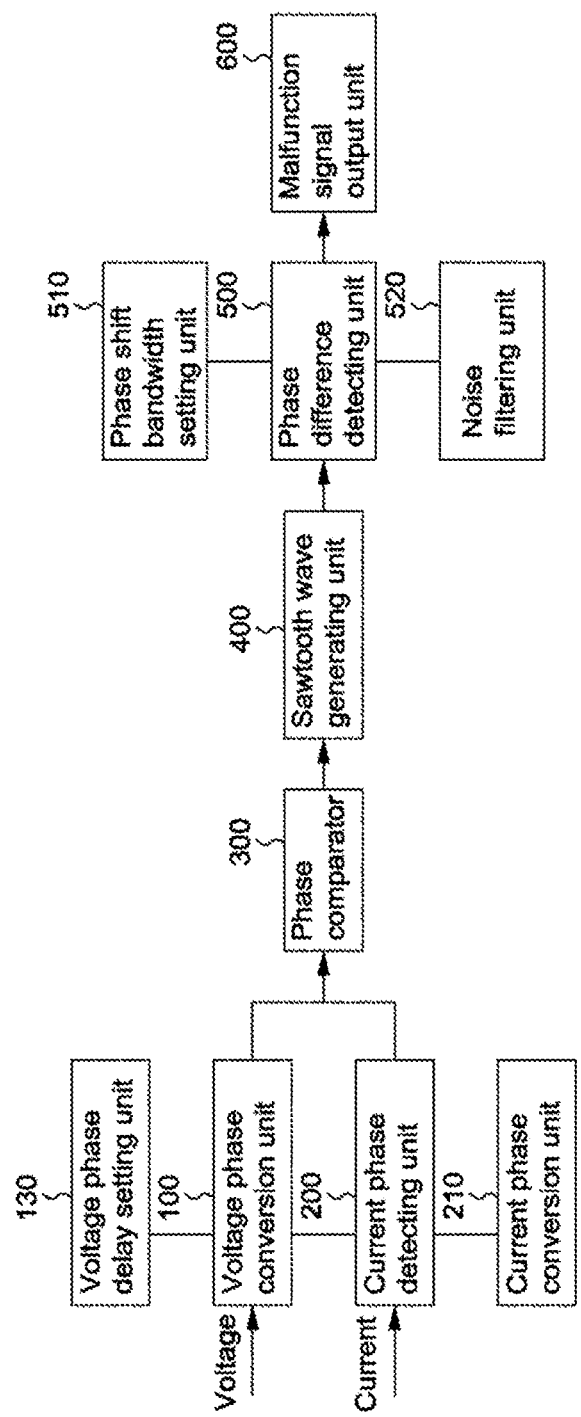
FIG. 1 is a block diagram showing a detecting apparatus for AC motor malfunction according to the present invention.
Figure 2:
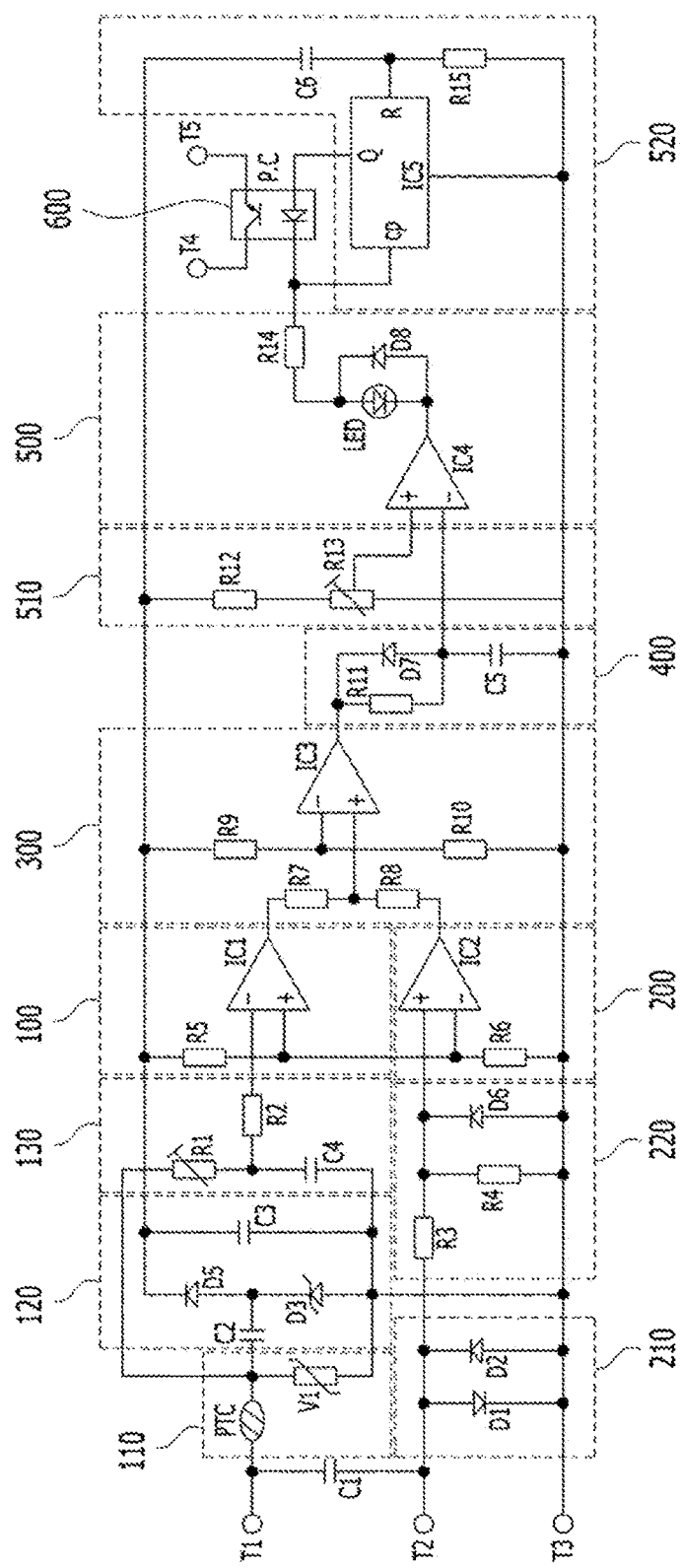
FIG. 2 is a circuit diagram showing a detecting apparatus for AC motor malfunction according to the present invention.

FIG. 1 is a block diagram showing a detecting apparatus for AC motor malfunction according to the present invention and FIG. 2 is a circuit diagram showing a detecting apparatus for AC motor malfunction according to the present invention.

Referring to FIG. 1, the detecting apparatus for AC motor malfunction according to the present invention includes a voltage phase delay setting unit 130, a voltage phase conversion unit 100, a current phase detecting unit 210, a current phase conversion unit 200, a phase comparator 300, a sawtooth wave generating unit 400, a phase difference detecting unit 500, a phase shift bandwidth setting unit 510, a noise filtering unit 520, and a malfunction signal output unit 600.

Referring to FIGS. 2, T1 and T3 are voltage input terminals for supplying a driving power of the AC motor and T2 and T3 are current input terminals. In the terminal T1 and T2, the capacitor C1 is connected in parallel with the whole circuit. This capacitor C1 for detecting the disconnection of the load side is selected with a minute capacity for example, 0.1 uF in comparison with the load-side capacitance. Therefore, in a state that the load is connected thereto, the capacity value of the capacitor C1 can be ignored. However, where the load is disconnected, it makes the phase of the current into a leading phase of 90° about the phase of the voltage, so that it can easily detect the load disconnection condition through the phase difference detection which will be described later.

As shown, a thermistor PTC and a varistor V1 are serially connected between the voltage input terminals T1 and T3, so that it constitutes a surge protection circuit unit 110. The surge protection circuit unit 110 absorbs the switching surge generated during the switching of the input power source so as to protect the circuits.

A rectifying circuit unit 120 having capacitors C2 and C3 and diodes D3 and D5 is installed between the connecting point of the thermistor PTC and the varistor V1 and the voltage input terminal T3. The diode D3 as a Zener diode serves to determine the rectifying voltage and the capacitor C3 is a smoothing capacitor. The rectifying circuit unit 120 serves to provide the driving power of the ripple counter IC5 and the comparators IC1, IC2, IC3, and IC4 of organizing the circuit and is utilized in providing the reference voltage of the comparators IC1, IC2, IC3, and IC4.

The voltage phase delay setting unit 130, which is connected to the voltage input terminals T1 and T3, serves to delay the phase of the input voltage from 0° to 90°. Referring to FIG. 2, the voltage phase delay setting unit 130 includes a variable resistance R1 and a capacitor C4, which are serially connected between the voltage input terminals T1 and T3, and a resistance R2 in which one side is connected to the connecting point of the capacitor C4 and variable resistance R1 and the other side is connected to an inverting terminal of the first comparator IC1.

The variable resistance R1 serves to charge and discharge the capacitor C4 through the inputted AC power voltage and it determines a phase angle inputted to the inverting input terminal of the first comparator IC1 through the resistance R2. At this time, the variable resistance R1 is controlled, so that the delay portion of the voltage phase can be set up.

The first comparator IC1 of the voltage phase conversion unit 100 as an inverting comparator serves to receive the output of the voltage phase delay setting unit 130 through the inverting terminal and receive the reference voltage through a non-inverting input terminal. The reference voltage is determined by a voltage-dividing resistance of the resistances R5 and R6, which are connected to the rectifying circuit unit 120. The first comparator IC1 serves to compare the output of the voltage phase delay setting unit 130 with the reference voltage and invert the voltage phase having the delayed phase so as to output it in the form of a square wave.

The current phase detecting unit 210 includes a pair of diodes D1 and D2, which are parallel-connected in the opposition direction to the current input terminals T2 and T3. The pair of diodes D1 and D2 severs to convert the current phase into the square wave of the crest value 1V.

As shown, the comparator protection circuit unit 220 is formed between the current phase detecting unit 210 and the current phase conversion unit 200. The comparator protection circuit unit 220 includes a resistance R3, which is serially connected between one side of a parallel connection point of the pair of diodes D1 and D2 and the non-inverting input terminal of the second comparator IC2, a resistance R4, which is parallel-connected between the resistance R3 and the other side of the parallel connection point of the pair of diodes D1 and D2, and a diode D6 for backdraft prevention. The comparator protection circuit unit 220 serves to prevent the second comparator IC2 from being damaged by the voltage generated in the current phase detecting unit 210.

The second comparator IC2 of the current phase conversion unit 200 as the non-inverting comparator serves to receive the output of the current phase detecting unit 210 through the non-inverting terminal and receive the reference voltage through the inverting terminal. The reference voltage is determined by the voltage-dividing resistance of the resistances R5 and R6. The second comparator IC2 serves to compare the output of the current phase detecting unit 210 with the reference voltage and output the current phase in the form of a square wave.

The phase comparator 300 serves to compare the output combining portion of the voltage phase conversion unit 100 and the output combining portion of the current phase conversion unit 200 with the reference voltage, so that the phase difference of the current phase and voltage phase is outputted in the form of the square wave.

Referring to FIG. 2, the phase comparator 300 includes resistances R7 and R8 connected between the output terminals of the second comparator IC2 and the first comparator IC1 so as to mix two outputs and the third comparator IC3 in which the non-inverting input terminal is connected to the connecting point of two resistances R7 and R8. In the inverting terminal of the third comparator IC3, the reference voltage determined by the voltage-dividing resistance of the resistances R9 and R10 connected to the rectifying circuit unit 120 is applied.

When the outputs of the first comparator IC1 and the second comparator IC2 are coincided with each other, the voltage corresponding to 1/2 of the power supply voltage is applied to the non-inverting terminal of the third comparator IC3. On the other hand, when the outputs thereof are different from each other, the positive voltage or the negative voltage having the same quantity as the power supply voltage is applied thereto. The third comparator IC3 serves to select a moment of illustrating that the outputs of the first comparator IC1 and the second comparator IC2 are different and the voltage is the same as the power supply voltage to be outputted.

The sawtooth wave generating unit 400 integrates the output of the phase comparator 300 to be converted in the form of the sawtooth wave. Referring to FIG. 2, the sawtooth wave generating unit 400 includes a resistance R11 and a diode D7 connected in parallel between the output terminal of the third comparator IC3 and the inverting terminal of the fourth comparator IC4, and a capacitor C5 connected to the parallel connection point of the resistance R11 and diode D7 and the AC input terminal T3.

The phase difference detecting unit 500 includes the fourth comparator IC4 for comparing the output of the sawtooth wave generating unit 400 with the reference voltage and outputting a pulse signal corresponding to the phase difference of the voltage phase and the current phase. The fourth comparator IC4 as the inverting comparator serves to receive the output of the sawtooth wave generating unit 400 through an inverting terminal. In the non-inverting input terminal of the fourth comparator IC4, the reference voltage is applied. Also, this reference voltage is determined by the phase shift bandwidth setting unit 510.

The phase shift bandwidth setting unit 510 includes a resistance R12 and a variable resistance R13 serially connected between the output terminal of the rectifying circuit unit 120 and the non-inverting terminal of the fourth comparator IC4. The variable resistance R13 is controlled, so that the phase shift bandwidth can be established and the sensitivity of the phase difference detection can be controlled.

The phase difference detecting unit 500 further includes a light emitting diode (LED) connected to the output terminal of the fourth comparator IC4 in the backward direction and a diode D8 parallel-connected with the LED. The output of the phase difference detecting unit 500 is transferred to an input terminal of a ripple counter IC5 of the noise filtering unit 520 through the diode D8. If the output of the phase difference detecting unit 500 is counted a predetermined number of times, the LED is turned on according to the output of the ripple counter IC5. It can be seen that the current phase is abnormally delayed or quickened through the lighting of the LED. Moreover, the LED can be used in confirming as to whether the voltage phase and the current phase are coincided with each other or not. The variable resistance R1 of the voltage phase delay setting unit 130 can be minutely adjusted, so that the lights-out point of the LED becomes the meeting point of the phase between the voltage and the current.

The noise filtering unit 520 includes a ripple counter IC5 and a resistance R15 and a capacitor C6 parallel-connected with the reset terminal of the ripple counter IC5. According to the time constant of the resistance R15 and the capacitor C6, the ripple counter 105 is reset after the power supply. Then, the new count operation is performed.

The ripple counter 105 as a means for preventing the phenomenon of generating the attenuation vibration of the motor owing to the current flux of the instantaneous AC voltage in that the motor is turned off and preventing the malfunction owing to the switching noise pulse etc. serves to count the number of the output of the phase difference detecting unit 500 by filtering such a noise.

The malfunction signal output unit 600 includes a photocoupler (PC) connected to the output terminal of the ripple counter IC5. According to the output of the ripple counter IC5, the light emitting diode of the photo-coupler outputs the optical signal and the electrically insulated photo transistor is turned on, so that the switching signal is outputted to the malfunction signal output terminals T4 and T5. The malfunction signal output terminals T4 and T5 can be connected to for example, an alarming device, a shutdown device or a recording device.

According to the detecting apparatus for AC motor malfunction and the distribution panel having the same, there are effects in that the voltage phase is established to be delayed according to the current delay property of the AC motor and the change of the current phase is accumulatively counted from the combining portion of the voltage phase and the current phase so as to output the malfunction thereof, thereby detecting the leading and lagging phenomenon of the current owing to the unusual condition of the AC motor to the high sensitivity and diagnosing various malfunctions, which are hard to detect in the prior art.

While the present invention has been described with respect to the specific embodiments, it will be apparent to those skilled in the art that various changes and modifications may be made without departing from the spirit and scope of the present invention as defined in the following claims.

What is claimed is:

1. A detecting apparatus for AC motor malfunction comprising:
   a voltage phase delay setting unit that is connected to a voltage input terminal of an AC motor for delaying a phase of an input voltage from 0° to 90°;
   a voltage phase conversion unit having a first comparator for comparing an output of the voltage phase delay setting unit with a reference voltage and converting a voltage phase into a square wave to be outputted;
   a current phase detecting unit that is connected to a current input terminal of the AC motor for detecting a current phase flowing to a load side in a form of a square wave;
   a current phase conversion unit having a second comparator for comparing an output of the current phase detecting unit with the reference voltage and converting a current phase into a square wave to be outputted;
   a phase comparator having a third comparator for comparing a output combining portion of the voltage phase conversion unit and the current phase conversion unit with the reference voltage and outputting a phase difference of the current phase and voltage phase in a form of a square wave;
   a sawtooth wave generating unit for integrating an output of the phase comparator to be converted in the form of a sawtooth wave;
   a phase difference detecting unit having a fourth comparator for comparing an output of the sawtooth wave generating unit with the reference voltage and outputting a pulse signal corresponding to the phase difference of the voltage phase and the current phase;
   a noise filtering unit having a ripple counter for counting an output of a phase difference detecting unit and generating an output when the accumulated count value is larger than a predetermined value; and a malfunction signal output unit for outputting a malfunction signal according to the output of the noise filtering unit.

2. The detecting apparatus for AC motor malfunction as claimed in claim 1, wherein the fourth comparator of the phase difference detecting unit is an inverting comparator, and a resistance R12 and a variable resistance R13 are serially connected to an non-inverting terminal of the fourth comparator so as to connect a phase shift bandwidth setting unit for adjusting a phase difference detection band of the phase difference detecting unit thereto.

3. The detecting apparatus for AC motor malfunction as claimed in claim 2, wherein the sawtooth wave generating unit comprises a resistance R11 and a diode D7 connected in parallel between an output terminal of the third comparator and the inverting terminal of the fourth comparator, and a capacitor C5 connected to a parallel connection point of the resistance R11 and diode D7 and one side of the voltage input terminals.

4. The detecting apparatus for AC motor malfunction as claimed in claim 1, wherein the voltage phase delay setting unit comprises a variable resistance R1 and a capacitor C4, which are serially connected between the voltage input terminals, and a resistance R2 in which one side is connected to a connecting point of the capacitor C4 and variable resistance R1 and the other side is connected to an inverting terminal of the first comparator.

5. The detecting apparatus for AC motor malfunction as claimed in claim 1, wherein the current phase detecting unit comprises a pair of diodes D1 and D2 parallel-connected in the opposition direction to the current input terminals and converting the current phase into a square wave of a crest value 1V.

6. The detecting apparatus for AC motor malfunction as claimed in claim 5, further comprising a comparator protection circuit unit having a resistance R3, which is serially connected between one side of a parallel connection point of the pair of diodes D1 and D2 and a non-inverting terminal of the second comparator, a resistance R4, which is parallel-connected between the resistance R3 and the other side of the parallel connection point of the pair of diodes D1 and D2, and a diode D6 for backdraft prevention; and preventing the second comparator from being damaged by the voltage generated in the current phase detecting unit.

7. The detecting apparatus for AC motor malfunction as claimed in claim 1, further comprising a surge protection circuit unit 110 having a thermistor PTC and a varistor V1 connected between the voltage input terminals and absorbing a switching surge of an input power source.

8. The detecting apparatus for AC motor malfunction as claimed in claim 1, wherein the malfunction signal output unit is a photo-coupler for outputting a switching signal according to an output signal of the ripple counter.

9. A distribution panel having the detecting apparatus for AC motor malfunction as claimed in claim 1.

* * * * *